US007098708B2

(12) United States Patent
Fahim

(10) Patent No.: US 7,098,708 B2
(45) Date of Patent: Aug. 29, 2006

(54) LOW-POWER DIRECT DIGITAL SYNTHESIZER WITH ANALOG INTERPOLATION

(75) Inventor: Amr M. Fahim, Solana Beach, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 11/186,451

(22) Filed: Jul. 20, 2005

(65) Prior Publication Data

US 2005/0253632 A1 Nov. 17, 2005

Related U.S. Application Data

(63) Continuation of application No. 10/684,797, filed on Oct. 14, 2003, now Pat. No. 6,958,635.

(51) Int. Cl.
*H03L 7/06* (2006.01)
(52) U.S. Cl. .................. 327/155; 327/160; 377/47; 377/48
(58) Field of Classification Search ............... None
See application file for complete search history.

(56) References Cited

U.S. PATENT DOCUMENTS

| 6,359,950 B1 * | 3/2002 | Gossmann et al. ......... 375/376 |
| 6,583,674 B1 * | 6/2003 | Melava et al. ............... 331/16 |
| 6,731,176 B1 * | 5/2004 | Su et al. ..................... 331/1 A |
| 6,836,526 B1 * | 12/2004 | Rana ........................... 377/47 |

* cited by examiner

*Primary Examiner*—Timothy P. Callahan
*Assistant Examiner*—An T. Luu
(74) *Attorney, Agent, or Firm*—Philip R. Wadsworth; Charles D. Brown; Alex C. Chen

(57) ABSTRACT

An MN counter with analog interpolation ("MNA counter") includes an MN counter, a multiplier, a delay generator, and a current generator. The MN counter receives an input clock signal and M and N values, accumulates M for each input clock cycle using a modulo-N accumulator, and provides an accumulator value and a counter signal with the desired frequency. The multiplier multiplies the accumulator value with an inverse of M and provides an L-bit control signal. The current generator implements a current locked loop that provides a reference current for the delay generator. The delay generator is implemented with a differential design, receives the counter signal and the L-bit control signal, compares a differential signal generated based on the counter and control signals, and provides the output clock signal. The leading edges of the output clock signal have variable delay determined by the L-bit control signal and the reference current.

3 Claims, 10 Drawing Sheets

LOW-POWER DIRECT DIGITAL SYNTHESIZER WITH ANALOG INTERPOLATION

RELATED APPLICATIONS

This application is a continuation of U.S. patent application Ser. No. 10/684,797, filed on Oct. 14, 2003, now U.S. Pat. No. 6,958,635.

BACKGROUND

1. Field

The present invention relates generally to electronics circuits, and more specifically to a direct digital synthesizer (DDS).

2. Background

In a modem communication device, multiple clock signals with frequencies that are unrelated may be needed for various functions. For example, a clock signal with a first frequency may be needed for a digital signal processing subsystem, another clock signal with a second frequency may be needed for a sampled analog subsystem, and so on.

Multiple clock signals with unrelated frequencies may be generated in various manners. In one conventional design, a clock generator with a single phase locked loop (PLL) is operated at a high frequency. The clock signal from this generator is divided in frequency by different integer values to obtain multiple output clock signals with different frequencies. This design places stringent requirements on the PLL in terms of performance and power consumption. In another conventional design, a separate PLL is provided for each subsystem requiring a clock signal with a different frequency. This design is undesirable because multiple PLLs for multiple clock signals normally consume a large amount of power and occupy a large area.

In yet another conventional design, an MN counter is used to divide an input clock signal (e.g., from a PLL) by a divider value to obtain an output clock signal with the desired frequency. The divider value is a ratio of two integer values M and N (i.e., N/M), where M<2·N for proper operation of the MN counter and N/M may be an integer or non-integer value. If the N/M divider value is not an integer, which is often the case, then the desired frequency is obtained by dividing the input clock signal in frequency by $\lfloor N/M \rfloor$ for some of the time and by $\lceil N/M \rceil$ for the remainder of the time, where $\lfloor x \rfloor$ is a floor operator that provides the nearest lower integer value for x and $\lceil x \rceil$ is a ceiling operator that provides the nearest higher integer value for x. This division with two integer values of $\lfloor N/M \rfloor$ and $\lceil N/M \rceil$ results in the output clock signal having inherent jitter that can be as large as one period of the input clock signal. For example, if the input clock frequency is 100 MHz, then the worst-case jitter for the output clock signal from the MN counter is 10 nsec.

Various methods for reducing jitter in the output clock signal from an MN counter have been proposed. For example, some methods reduce jitter by estimating the amount of phase shift needed in each output clock cycle to eliminate the jitter and then adjusting the output clock phase accordingly. In any case, most of these methods rely on absolute (voltage and/or current) reference levels to perform the phase shift estimation and/or adjustment and are thus prone to performance degradation due to circuit component mismatches and integrated circuit (IC) process variations.

There is therefore a need in the art for techniques to generate a clock signal having less jitter.

SUMMARY

An MN counter with analog interpolation (referred to herein as an "MNA counter") capable of generating an output clock signal having improved jitter performance is described herein. The jitter performance is minimally affected by IC process variations and system offsets using the design techniques described herein.

In a specific embodiment, the MNA counter includes an MN counter, a dither generator, an inverse unit, a multiplier, a delay generator, and a current generator. The dither generator provides a dither signal used to suppress spurious signals in the output clock signal caused by periodic jitter. The MN counter receives an input clock signal, the dither signal, and M and N values, accumulates M for each input clock cycle using a modulo-N accumulator, and provides an accumulator value and a counter signal. The counter signal has a frequency determined by the input clock frequency and the M and N values, and includes a pulse whenever the modulo-N accumulator wraps around. The inverse unit provides a Q value that is an inverse of M. The multiplier (which may be implemented with multiple pipelined stages to achieve higher operating speeds) multiplies the accumulator value with the Q value and provides an L-bit control signal. The current generator provides a reference current for the delay generator. The delay generator receives the counter signal and the L-bit control signal, compares a differential signal generated based on the counter and control signals, and provides the output clock signal. The leading edges of the output clock signal have variable delay determined by the L-bit control signal and the reference current.

The delay generator may be implemented with a differential design that utilizes two banks of capacitors. The capacitors in each bank may be implemented with binary decoding or thermal decoding and are selectable by the L-bit control signal. The selected capacitors in one bank are charged by one current source, and the selected capacitors in the other bank are discharged by another current source. The differential signal is defined by the two voltages on the selected capacitors in the two banks. The variable delay is determined by the amount of time taken for the two voltages to cross each other. Details of the delay generator are described below.

The current generator may be implemented with a replica delay generator and a current locked loop. The replica delay generator has the same design as the delay generator and is configured to provide a predetermined amount of delay (e.g., one half input clock period of delay) when the proper reference current is received. The current locked loop adjusts the reference current so that the predetermined amount of delay is obtained. The capacitors for the replica delay generator are matched to the capacitors for the delay generator, and the capacitors for both delay generators are arranged in a two-dimensional array using a common centroid layout to achieve good matching. Low-power is achieved by enabling the replica delay generator a sufficient number of (e.g., two) input clock cycles prior to each output clock edge transition, then disabling the replica delay generator after the transition is complete.

Various aspects, embodiments, and features of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout and wherein.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

Figure 1:
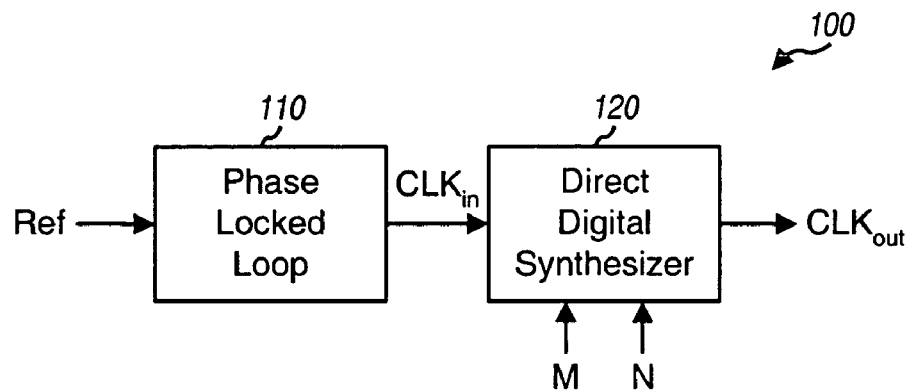
FIG. 1 shows a clock generation subsystem.

FIG. 1 shows a block diagram of a clock generation subsystem 100 that includes a phase locked loop (PLL) 110 and a direct digital synthesizer (DDS) 120. PLL 110 receives a reference signal (Ref) and generates an input clock signal (CLKin). The input clock signal has its frequency and/or phase locked to that of the reference signal. PLL 110 may be implemented with a phase-frequency detector (PFD), a loop filter, a voltage controlled oscillator (VCO), and a divider, as is known by one skilled in the art. DDS 120 receives the input clock signal and generates an output clock signal (CLKout) having a frequency that is a fraction of the input clock frequency.

Figure 2:
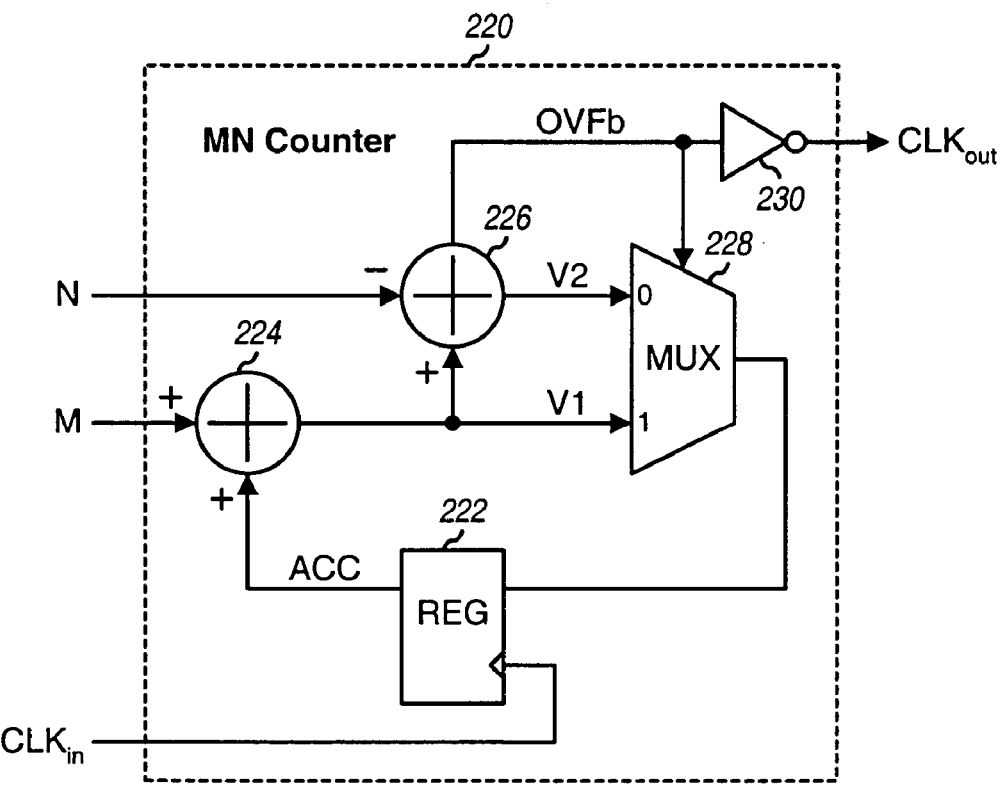
FIG. 2 shows a conventional DDS with an MN counter.

FIG. 2 shows a block diagram of a conventional MN counter 220 that may be used for DDS 120 in FIG. 1. MN counter 220 receives the input clock signal and the M and N values, each of which is an integer one or greater, and generates the output clock signal having a frequency that is N/M times that of the input clock signal. Within MN counter 220, a summer 224 receives and adds M to an accumulator value (ACC) from a register 222 and provides a first combined value (V1) to a summer 226 and to a '1' input of a multiplexer (MUX) 228. Summer 226 receives and subtracts N from the first combined value and provides a second combined value (V2) to a '0' input of multiplexer 228. Summer 226 also provides a one-bit inverted overflow signal (OVFb) to an inverter 230 and to a select input of multiplexer 228. The OVFb signal is logic low if there is an overflow (described below) and logic high otherwise. Multiplexer 228 provides the first combined value if there is no overflow and the second combined value if there is an overflow. Register 222 receives and stores the value from multiplexer 228. Inverter 230 receives and inverts the OVFb signal and provides the output clock signal.

MN counter 220 operates as follows. Register 222, summers 224 and 226, and multiplexer 228 collectively implement a modulo-N accumulator that stores a value ranging from 0 to N−1. For each input clock cycle, the accumulator accumulates M with the current accumulator value and provides the first combined value, which is stored back in register 222 if an overflow has not occurred. An overflow occurs whenever the first combined value exceeds N and is indicated by the OVFb signal being at logic low. When an overflow occurs, N is subtracted from the first combined value and the result is stored in register 222. A pulse is provided on the output clock signal when an overflow occurs.

Figure 3:
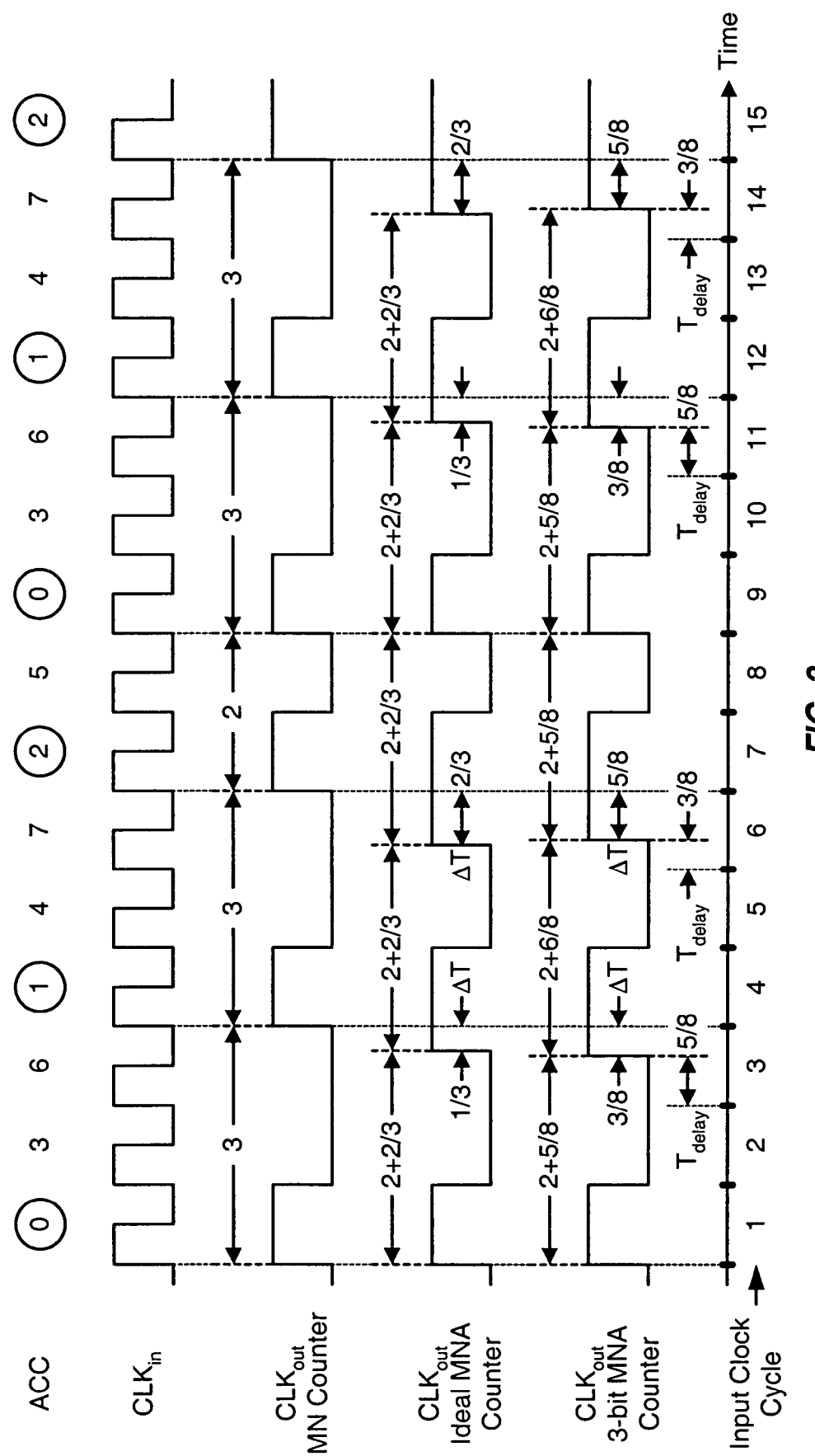
FIG. 3 shows a timing diagram for various types of DDS.

FIG. 3 shows a timing diagram that illustrates the operation of MN counter 220. For the example shown in FIG. 3, M=3, N=8, and the divider ratio is M/N=3/8. In the first input clock cycle, register 222 is reset and the accumulator value (ACC) is equal to zero. The accumulator value increases by M=3 in each of input clock cycles 2 and 3. In input clock cycle 4, the first combined value is nine, which exceeds N=8. A value of eight is then subtracted from the first combined value, and a value of one is stored in register 222. The same computation proceeds for each subsequent input clock cycle. A clock pulse is provided on the output clock signal whenever an overflow occurs and eight is subtracted from the first combined value.

As FIG. 3 illustrates, the output clock signal has a frequency that is 3/8 times the input clock frequency and is generated by dividing the input clock signal in frequency by 3, then by 3, then by 2, and so on. The average period of the output clock signal is $8T_{CLKin}/3$, as desired, where $T_{CLKin}$ is one input clock period. However, the output clock signal has instantaneous periods of $3T_{CLKin}$, $3T_{CLKin}$, and $2T_{CLKin}$, which give a worst-case cycle-to-cycle jitter of $T_{CLKin}$. Moreover, the jitter has a periodicity of $8T_{CLKin}$ since the jitter follows a pattern that repeats every eight input clock periods. This periodic jitter results in spurs appearing in the spectrum of the output clock signal. The spurs can have relatively large amplitude and may be detrimental for some applications (e.g., high quality audio) that require spectrally pure clock signals.

An MN counter with analog interpolation (an "MNA counter") can be used to reduce jitter and spurs. The MNA counter attempts to reduce jitter by shifting the position of the leading edges (e.g., rising edges) of the output clock signal such that all output clock periods are the same. This is achieved by determining the amount of phase shift needed for each output clock cycle to obtain the desired output clock period and then advancing the leading edge accordingly.

FIG. 3 also illustrates the operation of an ideal MNA counter for the example in which M=3 and N=8. The output clock signal from the ideal MNA counter is shown having a period of $8T_{CLKin}/3$ for each clock cycle. The amount of phase shift to achieve the ideal output clock period can be expressed as:

$$\Delta T_{idea,i} = \frac{ACC_i}{3} \cdot T_{CLKin}, \qquad \text{Eq (1)}$$

where $ACC_i$ is the accumulator value at the time of overflow. The leading edge of the output clock is advanced by $T_{CLKin}/3$ when the accumulator value is one, advanced by $2T_{CLKin}/3$ when the accumulator value is two, and not advanced when the accumulator value is zero.

If the phase shift can be generated exactly and if the leading edges can be advanced by this phase shift without errors, then all of the output clock cycles will have equal period and the ideal MNA counter will have zero jitter. A delay generator can be used to generate the desired phase shift for the MNA counter. The delay generator can be designed to generate phase shifts in discrete steps. Higher accuracy can be attained for the delay generator with greater circuit complexity, more die area, and higher power consumption. Thus, there is a trade-off between the accuracy of the delay generator and other system considerations.

FIG. 3 also illustrates the performance of an MNA counter with a 3-bit delay generator for the example in which M=3 and N=8. For this MNA counter, a fraction of 1/3 is estimated as 3/8, and a fraction of 2/3 is estimated as 5/8. Using these estimates, the output clock period is $21T_{CLKin}/8$, then $22T_{CLKin}/8$, then $21T_{CLKin}/8$, and so on, as shown in FIG. 3. The worst-case cycle-to-cycle jitter is $T_{CLKin}/8$ with the 3-bit delay generator.

For a delay generator with L-bit accuracy, where L>1, the required phase shift can be estimated as:

$$\Delta T_i = \frac{F_i}{2^L} \cdot T_{CLKin}, \qquad \text{Eq (2)}$$

$$\text{where } F_i = \text{round}\left(2^L \cdot \frac{ACC_i}{M}\right). \qquad \text{Eq (3)}$$

A phase shift to advance the output clock edge (i.e., a negative phase shift) can be obtained by operating the delay generator one input clock cycle early and generating a delay that is complementary to the negative phase shift. The delay may be expressed as:

$$T_{delay,i} = T_{CLKin} - \Delta T_i = \left(1 - \frac{F_i}{2^L}\right) \cdot T_{CLKin}. \qquad \text{Eq (4)}$$

In general, for an L-bit delay generator, the worst-case cycle-to-cycle jitter is $T_{CLKin}/2^L$, which is a reduction by a factor of $2^L$ over the jitter generated by the MN counter. Jitter is thus exponentially reduced for larger values of L (assuming no degradation due to circuit implementation). However, circuit complexity, area, and power consumption also increase exponentially with L. A suitable choice for L can be determined based on jitter requirements and other factors.

Figure 4:
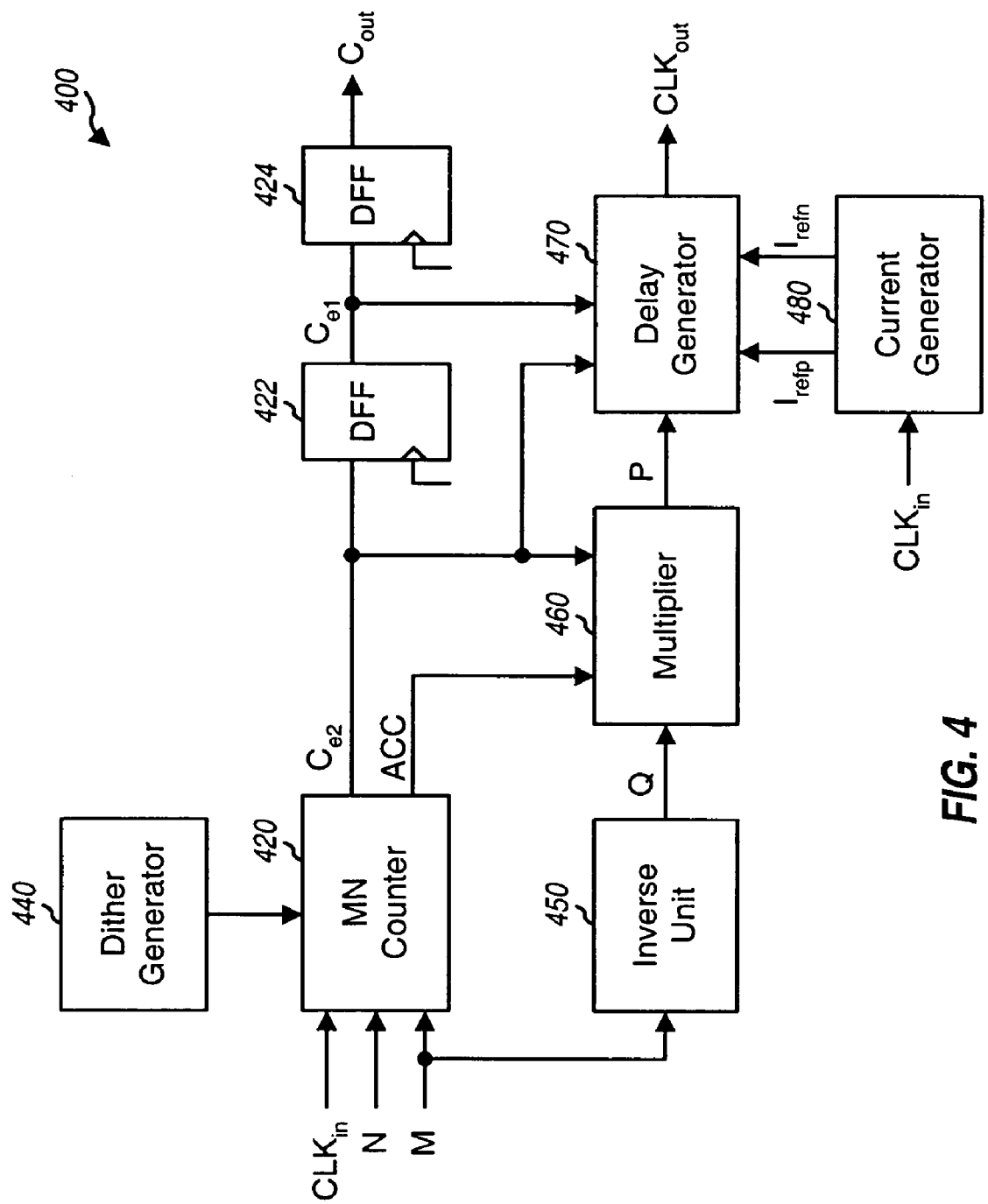
FIG. 4 shows an innovative DDS with an MNA counter.

FIG. 4 shows a block diagram of an MNA counter 400 that may be used for DDS 120 in FIG. 1. Within MNA counter 400, an MN counter 420 receives the input clock signal (CLKin), the M and N values, and a dither signal from a dither generator 440. The dither signal is used to suppress large amplitude spurious signals in the output clock signal caused by periodic jitter. MN counter 420 performs accumulation of M with a modulo-N accumulator to implement an "M divided by N" operation, as described above. MN counter 420 provides an accumulator value (ACC) and a counter signal (Ce2). The counter signal has the desired frequency and is derived based on an overflow signal within MN counter 420. A D flip-flop (D-FF) 422 receives and delays the Ce2 signal by one input clock cycle and provides a delayed counter signal (Ce1). Another D flip-flop (D-FF) 424 receives and delays the Ce1 signal by one input clock cycle and provides another delayed counter signal (Cout). The Ce1 and Ce2 signals are early with respect to the Cout signal by one and two input clock cycles, respectively, as indicated by the "e1" and "e2" designations. Since the phase shift needs to be generated before the overflow occurs, as shown in FIG. 3, the counter signal from MN counter 420 is delayed by two input clock cycles to obtain the Cout signal.

The Ce1 and Ce2 signals are used to enable generation of the desired delay prior to the Cout signal.

Dither generator 440 generates the dither signal and is described below. An inverse unit 450 receives M, derives an inverse of M, and provides an inverse value (Q), where $Q \cong 1/M$. A multiplier 460 receives the ACC value, the Q value, and the Ce2 signal. Multiplier 460 multiplies the ACC value with the Q value, when enabled by the Ce2 signal, and provides a P value for an L-bit control signal. The P value corresponds to the term $(1-F_i/2^L)$ in equation (4). The P value is obtained by quantizing the product of $ACC_i$ and Q using L bits (with rounding for the least significant bit) and inverting all of the L bits. The P value is indicative of the amount of delay (if any) required for the current output clock cycle. A delay generator 470 receives the P value and the Ce1 and Ce2 signals and generates the output clock signal (CLKout). The output clock signal has each leading edge shifted by the delay indicated by the P value. A current generator 480 generates the reference currents, $I_{refp}$ and $I_{refn}$, for delay generator 470. Each of the units in MNA counter 400 is described in further detail below.

Figure 5:
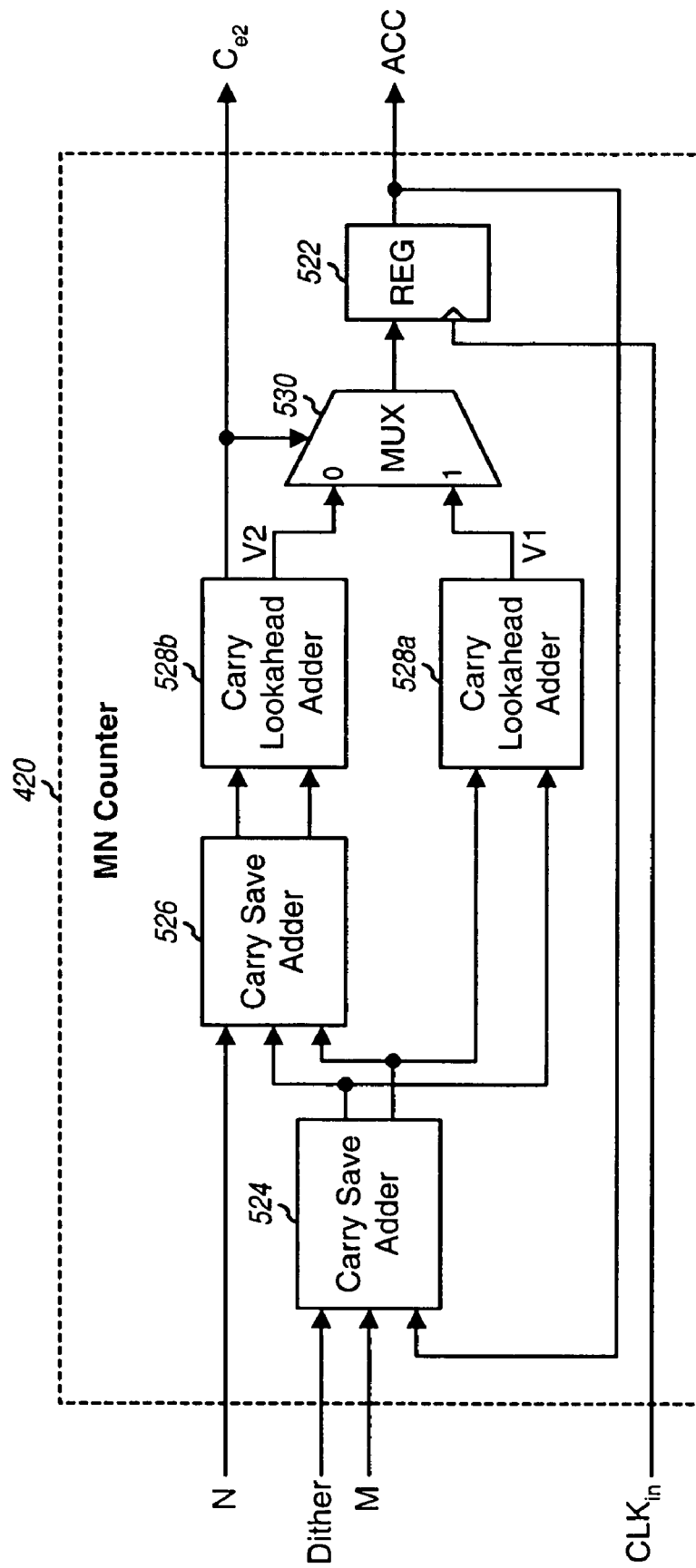
FIG. 5 shows an MN counter within the MNA counter.

FIG. 5 shows a block diagram of an embodiment of MN counter 420 within MNA counter 400. When N is not a power of 2, two full adders operate serially to perform accumulation of M using a modulo-N accumulator, as described above for FIG. 2. To achieve high operating speed for MNA counter 400, high-speed circuitry is used to implement the two full adders.

Within MN counter 420, a carry-save adder (CSA) 524 receives and combines M, the dither signal, and the accumulator value (ACC) (i.e., three input terms) and provides two output terms. A CSA 526 receives and sums the two output terms from CSA 524 and subtracts N and provides two output terms. A carry lookahead adder (CLA) 528a combines the two output terms from CSA 524 and provides the first combined value (V1) to a multiplexer 530. A CLA 528b combines the two output terms from CSA 526 and provides the second combined value (V2) to multiplexer 530. CLA 528b also provides the Ce2 signal. Multiplexer 530 provides either the V1 or V2 value to a register 522 depending on the Ce2 signal. MN counter 420 can be operated at a high operating speed because of the use of carry-save adders and carry lookahead adders. However, other designs may also be used for MN counter 420.

Dither generator 440 provides the one-bit dither signal that is used to randomize the jitter and reduce the amplitude of the spurs caused by periodic jitter from MN counter 420. The dither signal can be generated based on a pseudo-random number (PN) sequence. Dither generator 440 may thus be implemented with a linear feedback shift register (LFSR) that is configured to implement a polynomial generator for a PN sequence. For example, a 26-bit LFSR that implements a polynomial generator $x^{25}+x^{24}+x^{20}+1$ may be used for dither generator 440. The dither signal comprises a repeating pseudo-random sequence of +1 and −1 and does not introduce an average frequency offset to the output clock frequency. Other designs for generating the one-bit dither signal may be used without affecting the scope of the embodiments herein.

Inverse unit 450 generates a value of $Q \cong 1/M$. Inverse unit 450 may be implemented with a serial division algorithm, a look-up table, or some other manner. Since the Q value is typically computed once and does not change for a given operating mode, this value may be provided by a unit external to MNA counter 400. For example, a controller can compute and provide the Q value via a register.

Figure 6:
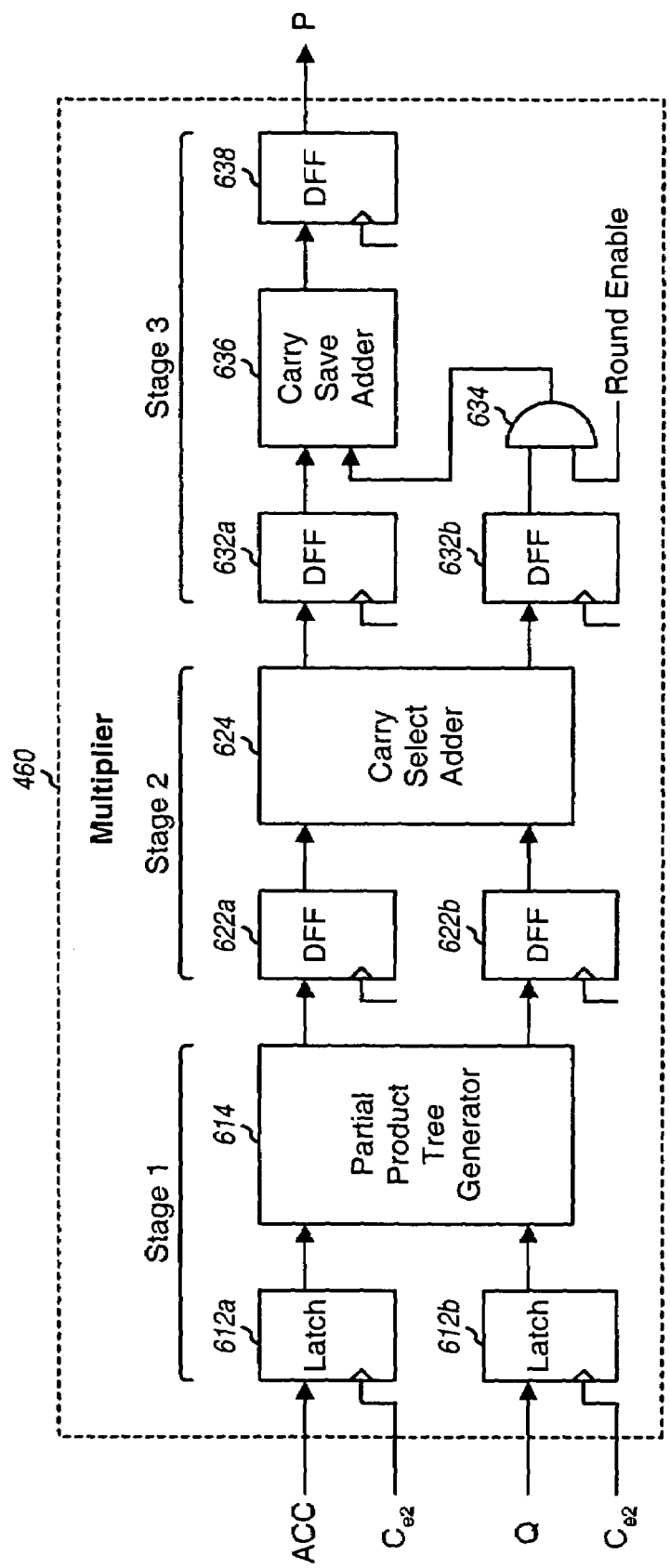
FIG. 6 shows a multiplier within the MNA counter.

FIG. 6 shows a block diagram of an embodiment of multiplier 460 within MNA counter 400 in FIG. 4. Multiplier 460 operates when an overflow occurs in MN counter 420, which may be infrequent for some values of M and N. Although the activity rate may be low, the execution window for multiplier 460 is equal to the input clock rate, which may be relatively high. To support a high input clock frequency, multiplier 460 is implemented as a three-stage pipelined multiplier.

For the first pipeline stage, latches 612a and 612b latch the ACC and Q values, respectively, with the Ce2 signal. Latches 612a and 612b inhibit the ACC value from rippling through multiplier 460 if no overflow occurs in MN counter 420. A partial product tree generator 614 performs multiplication of the ACC and Q values by generating partial product terms and accumulating these terms in multiple accumulation stages. Partial product tree generator 614 provides two partial product terms.

For the second pipeline stage, D flip-flops 622a and 622b store the two partial product terms from partial product tree generator 614. A carry-select adder 624 combines the two partial product terms from D flip-flops 622a and 622b and provides the final result. The partial product accumulation is divided into two pipeline stages to support higher operating speed for multiplier 460. The multiplication can be partitioned into more than two stages for even higher operating speed.

For the third pipeline stage, a D flip-flop 632a stores the most significant bits (MSB) of the final result from carry-select adder 624 and a D flip-flop 632b stores the least significant bit (LSB) of the final result. An AND gate 634 performs a logical AND of the LSB from D flip-flop 632b with a Round Enable signal. A CSA 636 combines the MSB of the final result from D flip-flop 632a with the output of AND gate 634 and provides the combined result to a D flip-flop 638. The rounding of the final result can reduce truncation errors by ½ LSB. D flip-flop 638 provides the P value, which is approximately equal to ACC/M and quantized to L bits. For illustrative ease, the bit inversion to obtain the term $(1-F_i/2^L)$ in equation (4) is not explicitly shown in FIG. 6. Multiplier 460 may also be implemented with other designs (e.g., a look-up table that is indexed by the accumulator value).

A delay generator can generate a number of discrete delays by charging and discharging a bank of capacitors. Different delays can be obtained by turning on (i.e., selecting) different combination of capacitors in the bank. The delay generated by the delay generator can be expressed as:

$$T_{delay} = \frac{C_{load} \cdot V_{swing}}{I_{ch}}, \quad \text{Eq (5)}$$

where $C_{load}$ is the load capacitance (which is dominated by the selected capacitors in the bank), $I_{ch}$ is the current used to charge and discharge the load capacitor, and $V_{swing}$ is the voltage swing of the delay generator. Equation (5) shows that the delay is dependent on three parameters that are in turn dependent on the IC manufacturing process. Since accurate generation of the delay is needed to achieve good jitter performance, techniques are described herein to mitigate the effects of $C_{load}$, $V_{swing}$, and $I_{ch}$ on jitter performance.

Figure 7:
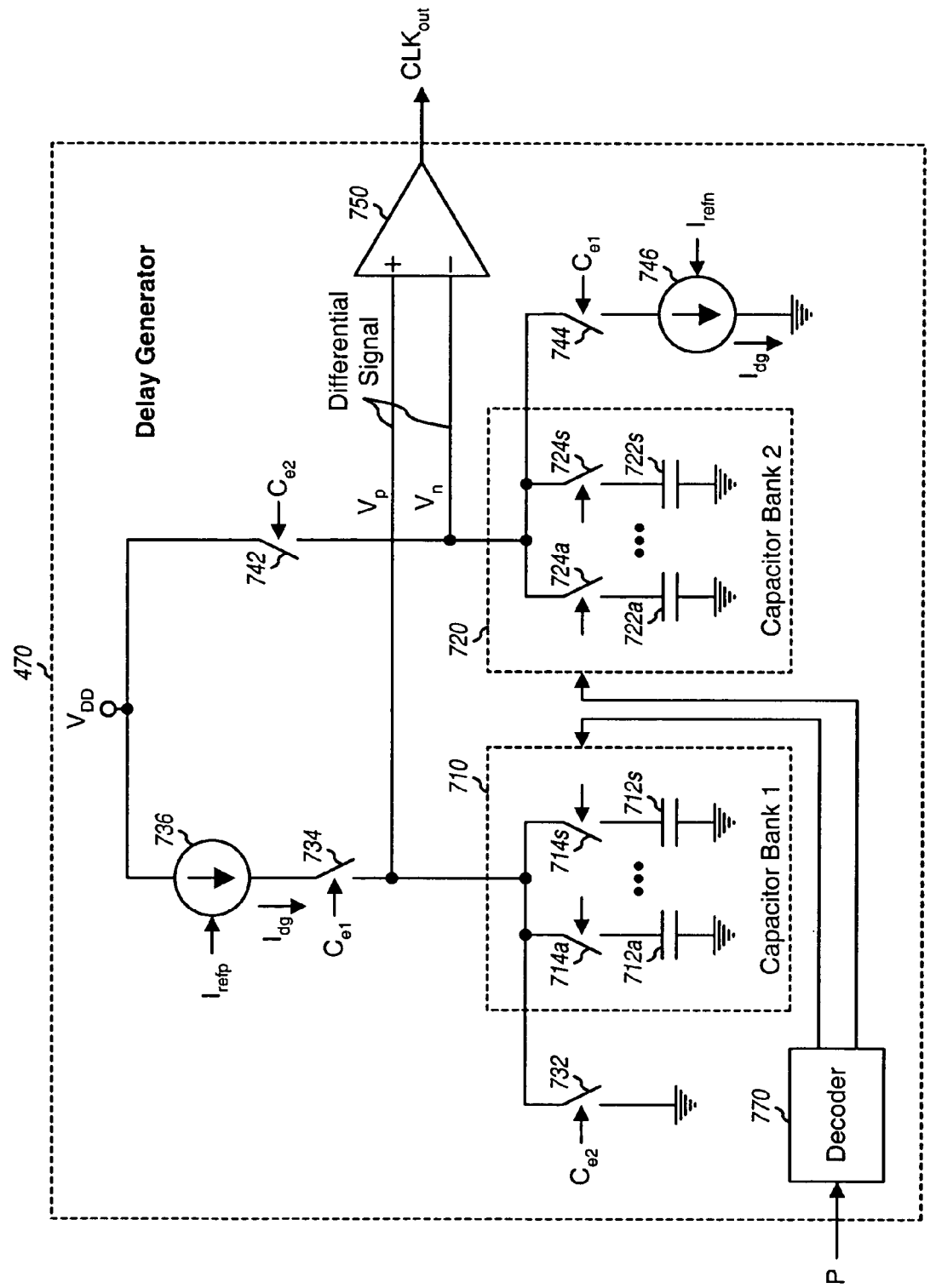
FIG. 7 shows a delay generator within the MNA counter.

FIG. 7 shows a block diagram of a delay generator 470 within MNA counter 400 in FIG. 4. Delay generator 470 uses a differential design to provide good rejection of power supply noise and to mitigate the effects of circuit component mismatches. Delay generator 470 also uses a reference current from a current locked loop (CLL) to accurately generate the charging current.

Delay generator 470 includes two banks of capacitors, 710 and 720. Bank 710 includes S capacitors 712a through 712s, each having one end coupled to circuit ground and the other end coupled to a node $V_p$ via switches 714a through 714s, respectively. S is dependent on the number of bits (L) and the design for delay generator 470. Bank 720 includes S capacitors 722a through 722s, each having one end coupled to circuit ground and the other end coupled to a node $V_n$ via switches 724a through 724s, respectively. A switch 732 has one end coupled to node $V_p$ and the other end coupled to circuit ground. A switch 734 has one end coupled to node $V_p$ and the other end coupled to one end of a current source 736. The other end of current source 736 couples to a supply voltage ($V_{DD}$). A switch 742 has one end coupled to node $V_n$ and the other end coupled to $V_{DD}$. A switch 744 has one end coupled to node $V_n$ and the other end coupled to one end of a current source 746. The other end of current source 746 couples to circuit ground.

A comparator 750 has a non-inverting input coupled to node $V_p$, an inverting input coupled to node $V_n$, and an output that provides the output clock signal. A decoder 770 receives the P value from multiplier 460 and generates control signals for switches 714 and 724 to select the desired capacitors and deselect the remaining capacitors.

Current source 736 receives the reference current $I_{refp}$ from current generator 480 provides a charging current of $I_{dg}$. Current source 746 receives the reference current $I_{refn}$ from current generator 480 and provides a discharging current of $I_{dg}$. Current sources 736 and 746 may be implemented with constant-$g_m$ current sources or some other types of current sources. Capacitors 712 and 722, switches 714 and 724, and decoder 770 may be implemented as described below.

Delay generator 470 operates as follows. When the Ce2 signal is activated due to an overflow in MN counter 420, switches 714, 724, 732, and 742 are all turned on for one input clock cycle, capacitors 712 in bank 710 are discharged to circuit ground by switch 732, capacitors 722 in bank 720 are precharged to $V_{DD}$ by switch 742, node $V_p$ is at circuit ground, node $V_n$ is at $V_{DD}$, and the output clock signal is at logic low. One input clock cycle later, switches 732 and 742 are turned off and only selected ones of switches 714 and 724 in banks 710 and 720 are turned on by the P value from multiplier 460. The selected capacitors in banks 710 and 720 are those with their associated switches turned on. In this same input clock cycle, switches 734 and 744 are turned on by the Ce1 signal, the selected capacitors in bank 710 are charged toward $V_{DD}$ by current source 736, the selected capacitors in bank 720 are discharged toward circuit ground by current source 746, the voltage on node $V_p$ rises, and the voltage on node $V_n$ drops. A differential signal is defined by the voltages on nodes $V_p$ and $V_n$. When the voltage on node $V_p$ exceeds the voltage on node $V_n$ (i.e., when the two voltages cross), the output clock signal transitions to logic high. The leading edge of the output clock signal is thus determined by the amount of delay provided by delay generator 470. The enable signals for delay generator 470 are delayed appropriately to line up with the arrival of the P signal from multiplier 460.

The output clock signal provided by delay generator 470 within MNA counter 400 does not have 50% duty cycle. To obtain an output clock signal with 50% duty cycle, the M value may be doubled, and the output signal from comparator 750 may be divided by two (2) to obtain the output clock signal. The maximum N/M ratio is then limited to 0.5 for proper operation of the MNA counter.

The delay generated by delay generator 470 may be expressed as:

$$T_{delay,i} = 2^L \cdot C_{unit} \cdot \left[1 - \frac{ACC_i}{M}\right] \cdot \frac{V_{DD}}{I_{dg} \cdot 2}, \quad \text{Eq (6)}$$

where $C_{unit}$ is a unit capacitance. In equation (6), the factor $V_{DD}/2$ is the voltage swing for the capacitors in each bank with the differential design and corresponds to $V_{swing}$ in equation (5). The factor $2^L \cdot C_{unit}$ is the total capacitance for all capacitors in one bank. The factor $[1-ACC_i/M]$ corresponds to the P value from multiplier 460. The factor $C_{dg}=2^L \cdot C_{unit} \cdot [1-ACC_i/M]$ is the capacitance for all selected capacitors in one bank and corresponds to $C_{load}$ in equation (5). The unit capacitance $C_{unit}$ and the charging current $I_{dg}$ are selected such that delay generator 470 provides one input clock period ($T_{CLKin}$) of delay when all capacitors in the bank are selected (i.e., when $C_{dg}=2^L \cdot C_{unit}$). The capacitor size directly affects jitter, area, and power consumption. A suitable capacitor size can be selected based on a tradeoff of all of these considerations.

The accuracy of delay generator 470 is dependent on the accuracy of the unit capacitance $C_{unit}$, the voltage swing $V_{DD}$, and the charging current $I_{dg}$, which can vary due to IC process variations. A current locked loop can be used to generate a requirement current that tracks process variation of the delay generator circuitry and mitigates the effects of these three parameters on the accuracy of delay generator 470.

Figure 8A:
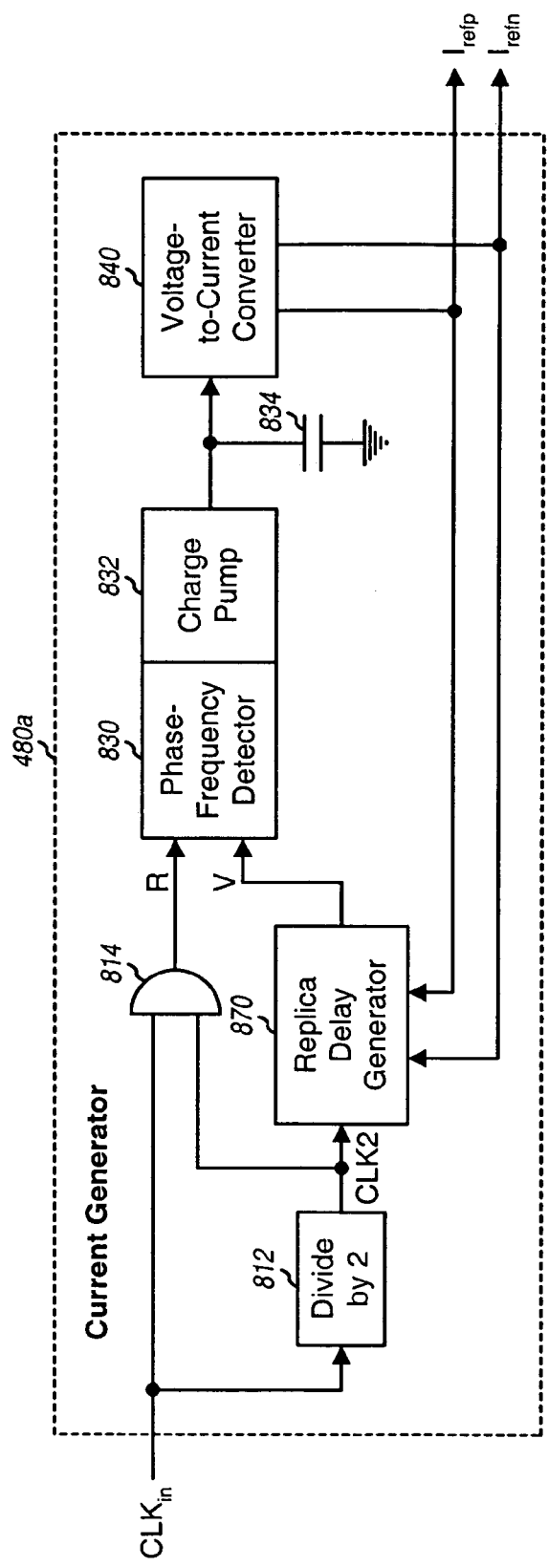
FIG. 8A shows a current locked loop for the MNA counter.

FIG. 8A shows a block diagram of a current locked loop 480a, which is one embodiment of bias current generator 480 in FIG. 4. Within current locked loop 480a, a divide-by-2 unit 812 receives and divides the input clock signal (CLKin) by two and provides a divided clock signal (CLK2). Unit 812 uses the trailing edges of the input clock signal to perform the divide-by-2. An AND gate 814 performs a logical AND of the CLKin signal and the CLK2 signal and provides a reference clock signal (R). A replica delay generator 870 delays the CLK2 signal by one half input clock period and provides a delayed clock signal (V). Although not shown in FIG. 8A, the CLK2 signal may be provided to a dummy AND gate matched to AND gate 814, and the output of the dummy AND gate can be provided to delay generator 870.

A phase-frequency detector (PFD) 830 compares the phase of the reference clock signal and the phase of the delayed clock signal and provides a phase error. PFD 830 may be implemented with an early-late detector that is known in the art. A charge pump 832 converts the phase error into a current. A loop filter, implemented with a single capacitor 834, filters the current from charge pump 832 and also converts the current into a voltage. Capacitor 834 can be a small capacitor if the input clock rate is high. A voltage-to-current (V-to-I) converter 840 converts the voltage on capacitor 834 back into a current using current mirrors and provides the reference currents $I_{refp}$ and $I_{refn}$ to replica delay generator 870. Replica delay generator 870 adjusts its delay based on the reference currents $I_{refp}$ and $I_{refn}$ such that the delayed clock signal is time-aligned with the reference clock signal. V-to-I converter 840 also provides the reference currents $I_{refp}$ and $I_{refn}$ to current sources 736 and 746 within delay generator 470.

Figure 8B:
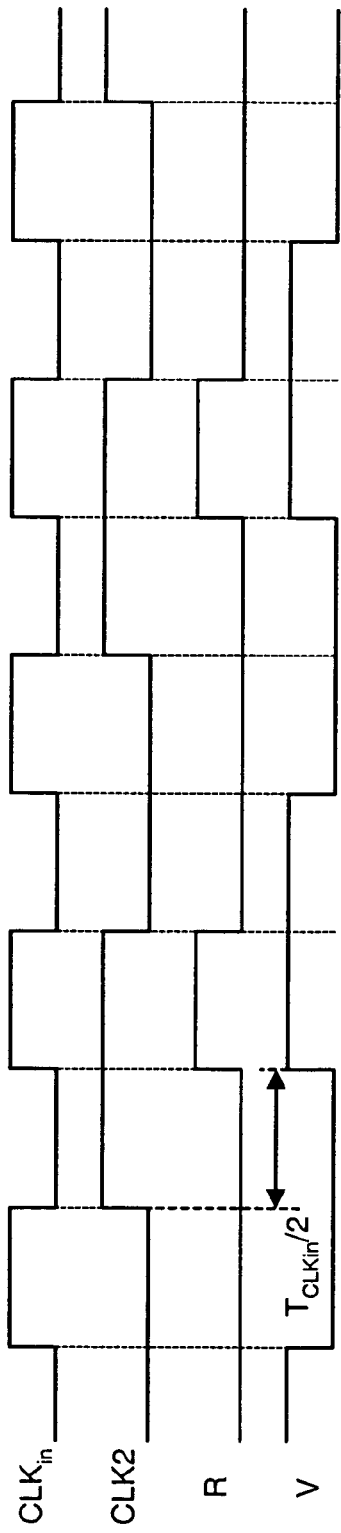
FIG. 8B shows a timing diagram for the current locked loop.

FIG. 8B shows a timing diagram for current locked loop 480a. The reference clock signal is the input clock signal divided by two and delayed by one half input clock period. Replica delay generator 870 generates a delay of one half input clock period for the divided clock signal when the correct reference current is received from V-to-I converter 840. The current lock loop adjusts the reference current such that the leading edges of the reference clock signal and the delayed clock signal are time-aligned.

The closed loop transfer function H(s) for current locked loop 480a may be expressed as:

$$H(s) = \frac{\frac{I_{cp}}{\pi} \cdot \frac{1}{C_{1f}} \cdot K_{v2i}}{s + \frac{I_{cp}}{\pi} \cdot \frac{1}{C_{1f}} \cdot K_{v2i} \cdot K_{dg}}, \quad \text{Eq (7)}$$

where $I_{cp}$ is the current of charge pump 832, $C_{1f}$ is the capacitance of capacitor 834 for the loop filter, $K_{v2i}$ is the gain of V-to-I converter 840 (in units of µA/V), and $K_{dg}$ is the gain of replica delay generator 870 (in units of nsec/µA). Equation (7) indicates that current locked loop 480a is a single pole system that is unconditionally stable. However, similar to a delay locked loop, the current locked loop can false lock to a zero time period or a double time period. False lock can be prevented by ensuring that the forward gain is not too large. One method of achieving this is to control the charge pump current $I_{cp}$ (e.g., from 5 µA to 40 µA, in 5 µA steps). A large charge pump current $I_{cp}$ may be used initially to achieve fast locking. A small current may be used thereafter to prevent the current locked loop from overshooting. The gain $K_{v2i}$ is adjusted such that delay generator 870 is capable of producing one half input clock period of delay for the entire range of input clock frequencies and over all process corners. The gain $K_{dg}$ is controlled by the size of the capacitors in delay generator 870.

Replica delay generator 870 has the same design as delay generator 470. The delay generated by replica delay generator 870 may be expressed as:

$$T_{delay,rbg} = \frac{C_{rdg} \cdot V_{DD}}{I_{rdg} \cdot 2} = \frac{T_{CLKin}}{2}, \quad \text{Eq (8)}$$

where $C_{rdg}$ is the capacitance and $I_{rdg}$ is the charging current for replica delay generator 870. Replica delay generator 870 is designed to provide a delay of $T_{CLKin}/2$ with capacitance $C_{rdg}$ and current $I_{rdg}$. Delay generator 470 is designed to provide a delay of $T_{CLKin}$ with capacitance $2^L \cdot C_{unit}$ and current $I_{dg}$. The capacitance to current (C/I) ratio for replica delay generator 870 is thus one half of the C/I ratio for delay generator 470, since the same voltage swing $V_{DD}$ is used for both generators. For example, the same charging current may be used for both delay generators (i.e., $I_{dg}=I_{rdg}$), and the capacitance of replica delay generator 870 may be set to half of the total capacitance of delay generator 470 (i.e., $C_{rdg}=2^L \cdot C_{unit}/2$). In this case, the accuracy of delay generator 470 is dependent on the matching between the capacitance of delay generator 470 and the capacitance of replica delay generator 870. Current locked loop 480a thus removes the effects of the supply voltage $V_{DD}$ and the charging current $I_{dg}$, and the accuracy of delay generator 470 is not impacted by these two parameters. Current locked loop 480a also effectively removes the effect of the load capacitor $C_{dg}$, and the accuracy of delay generator 470 is dependent on the matching of the capacitors for generators 470 and 870 instead of the capacitance of these capacitors.

The capacitors for delay generator 470 and replica delay generator 870 may be implemented in various manners. In one embodiment, binary decoding is used for the capacitors in each of banks 710 and 720 in FIG. 7. For this embodiment, each bank includes L capacitors having binary weighted capacitance of $C_{unit}$, $2C_{unit}$, $4C_{unit}$, . . . and $2^{L-1} \cdot C_{unit}$. Each capacitor is selected or deselected based on a respective bit of the P value from multiplier 460. In another embodiment, thermal decoding is used for the capacitors in each bank to improve linearity. For this embodiment, $2^L$ capacitors are provided for each bank, and each capacitor has the same capacitance of $C_{unit}$. The $2^L$ capacitors can be matched more easily because they all have the same dimension. Consequently, smaller matching error is encountered and greater linearity is achieved. As many of the $2^L$ capacitors are selected as necessary based on the P value. The selected capacitors may be dispersed (e.g., randomly selected) among the $2^L$ capacitors to reduce gradient linearity error (if any), which is a systematic error across an IC die caused by manufacturing.

Figure 9:
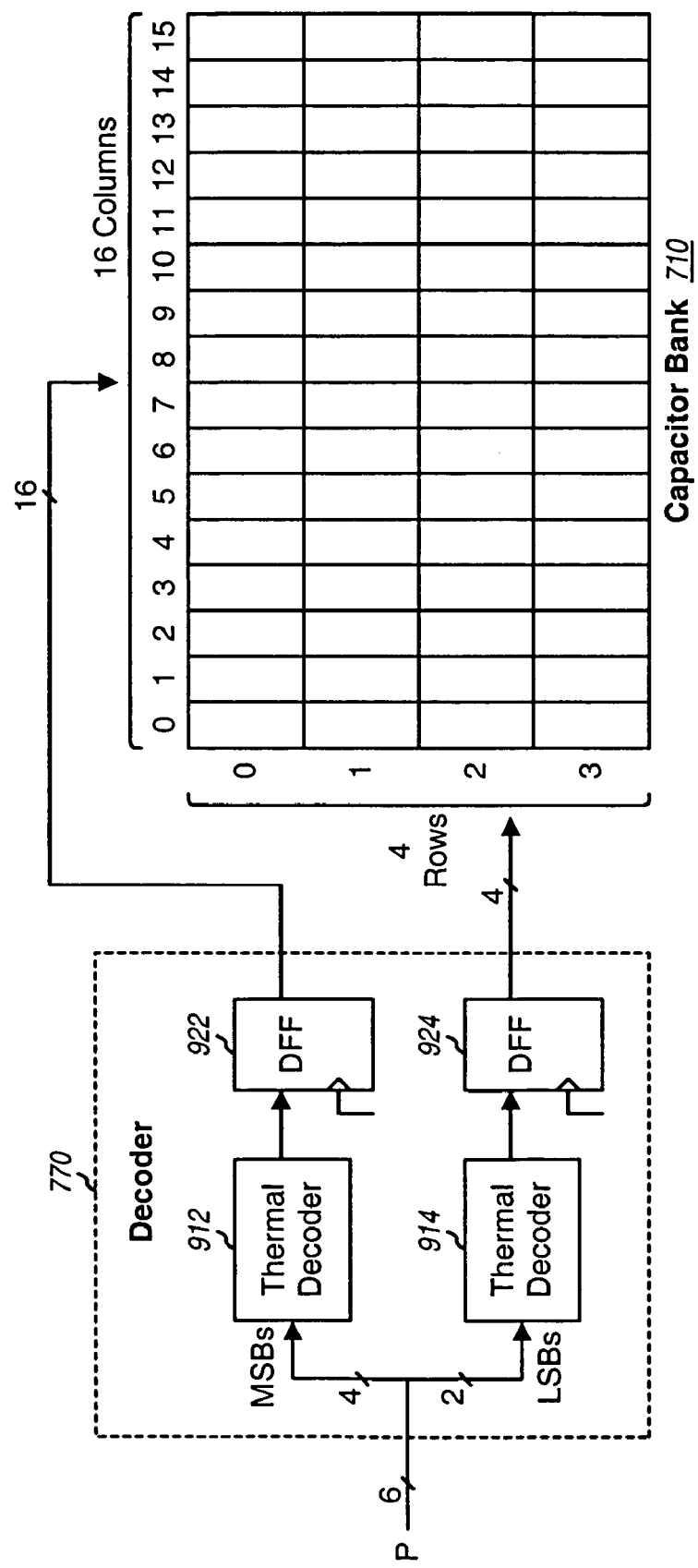
FIG. 9 shows a capacitor bank and a decoder within the delay generator.

FIG. 9 shows a diagram of an embodiment of capacitor bank 710 and decoder 770. For this embodiment, delay generator 470 has 6-bit accuracy (i.e., L=6) and thermal decoding is used for the capacitors. Bank 710 includes 64 capacitors arranged in a 4×16 array with four rows and sixteen columns. Each capacitor has a capacitance of $C_{unit}$. Decoder 770 receives the 6-bit P value and generates the controls for the 64 capacitors. Within decoder 770, a thermal decoder 912 receives the four MSBs of the P value and provides to a D flip-flop 922 sixteen column controls for the sixteen columns of the 4×16 array. A thermal decoder 914 receives the two LSBs of the P value and provides to a D flip-flop 924 four row controls for the four rows of the 4×16 array. D flip-flops 922 and 924 provide controls for the columns and rows, respectively, and ensure glitch free transition in delay generator 470.

Figure 10:
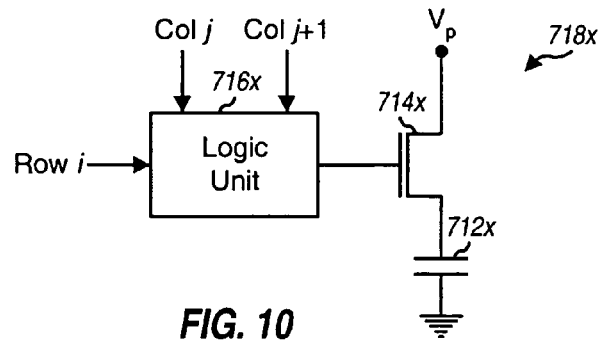
FIG. 10 shows one capacitor unit within the capacitor bank.

FIG. 10 shows a diagram for one capacitor unit 718x among $2^L$ capacitor units for capacitor bank 710 for an implementation using thermal decoding. Capacitor cell 718x is for one row of one column of the 4×16 array shown in FIG. 9. Capacitor cell 718x includes a capacitor 712x, an N-channel transistor 714x, and a logic unit 716x. Capacitor 712x is one of capacitors 712 in bank 710 and has a capacitance of $C_{unit}$, and N-channel transistor 714x is for one of switches 714 in bank 710. Logic unit 716x receives a control for row i and controls for column j and j+1 from decoder 770 and generates a gate signal for N-channel transistor 714x based on the three input controls. To individually select 64 capacitors in the 4×16 array for bank 710, 64 control signals would be needed. To reduce the number of control signals required, the capacitors in the 4×16 array are selected one column at a time. For example, to select nine capacitors, all four capacitors in the first and second columns are selected, and one capacitor in the third column is selected. If any capacitor in the next column j+1 is selected, then all capacitors in the current column j are selected. When enabled, N-channel transistor 714x couples capacitor 712x to node $V_p$. The size of N-channel transistor 714x can affect the jitter reduction capability of MNA counter 400. A small-size N-channel transistor 714x can provide better jitter performance.

With the current locked loop, the accuracy of delay generator 470 is dependent on the matching between the capacitors for delay generator 470 and replica delay generator 870. To achieve good matching, the capacitors for both delay generators 470 and 870 can be implemented as one array arranged in a two-dimensional (2-D) common centroid layout.

Figure 11:
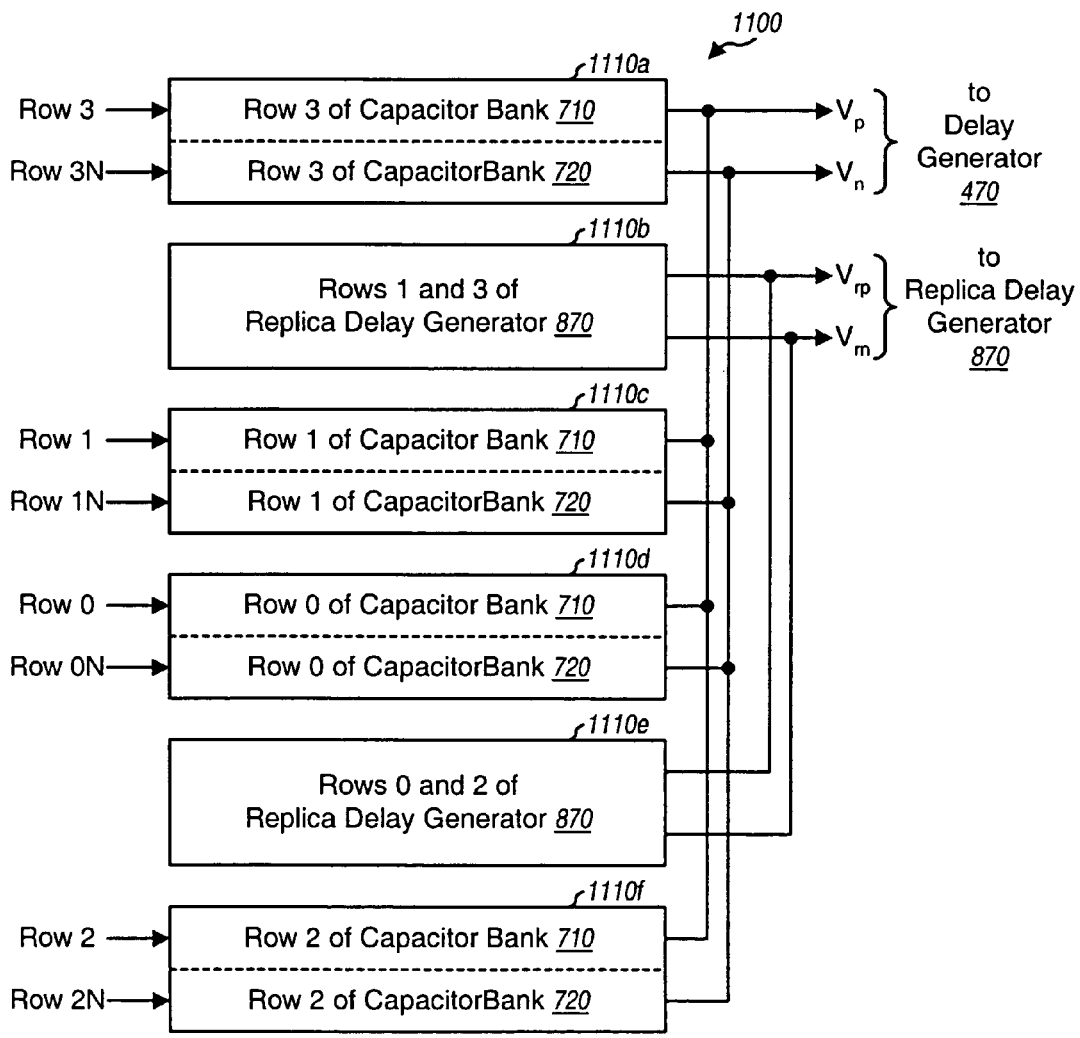
FIG. 11 shows a capacitor array for the delay generator and replica delay generator.

FIG. 11 shows a diagram of an exemplary implementation of a capacitor array 1100 for delay generator 470 and replica delay generator 870 using a 2-D interdigitated, common centroid layout. In this example, delay generator 470 has 6-bit accuracy, and the 64 capacitors for each of banks 710 and 720 are arranged into four rows, as described above. Capacitor array 1100 includes twelve rows—four rows for the capacitors in bank 710, four rows for the capacitors in bank 720, and four rows for the capacitors in replica delay generator 870.

For the exemplary implementation shown in FIG. 11, capacitor array 1100 includes six sections 1110a through 1110f. Section 1110a includes capacitor row 3 for both banks 710 and 720, section 1110b includes capacitor rows 1 and 3 for replica delay generator 870, section 1110c includes capacitor row 1 for both banks, section 1110d includes capacitor row 0 for both banks, section 1110e includes capacitor rows 0 and 2 for replica delay generator 870, and section 1110f includes capacitor row 2 for both banks. The capacitors in rows 0, 1, 2, and 3 for bank 710 are coupled to node $V_p$ when enabled. The capacitors in rows 0, 1, 2, and 3 for bank 720 are coupled to node $V_n$ when enabled. The capacitors for replica delay generator 870 are always on and no controls are needed, as indicated in FIG. 11. The capacitors in the rows for replica delay generator 870 are coupled to two corresponding nodes $V_{rp}$ and $V_m$ within the generator 870.

The MNA counter design described herein provides good performance and other advantages. The differential design allows for a reduction in the size of the capacitors in delay generators 470 and 870. The smaller capacitor size results in less power being consumed to generate the desired delay. Moreover, a smaller area is required to implement the smaller-size capacitors. The current locked loop removes the dependency on voltage swing and charging current, which improves the accuracy of the delay generator. To reduce power consumption, the current locked loop and multiplier may be turned on one or two input clock cycles before they are needed (e.g., using the Ce1 and Ce2 signals) and turned off thereafter.

Figure 12:
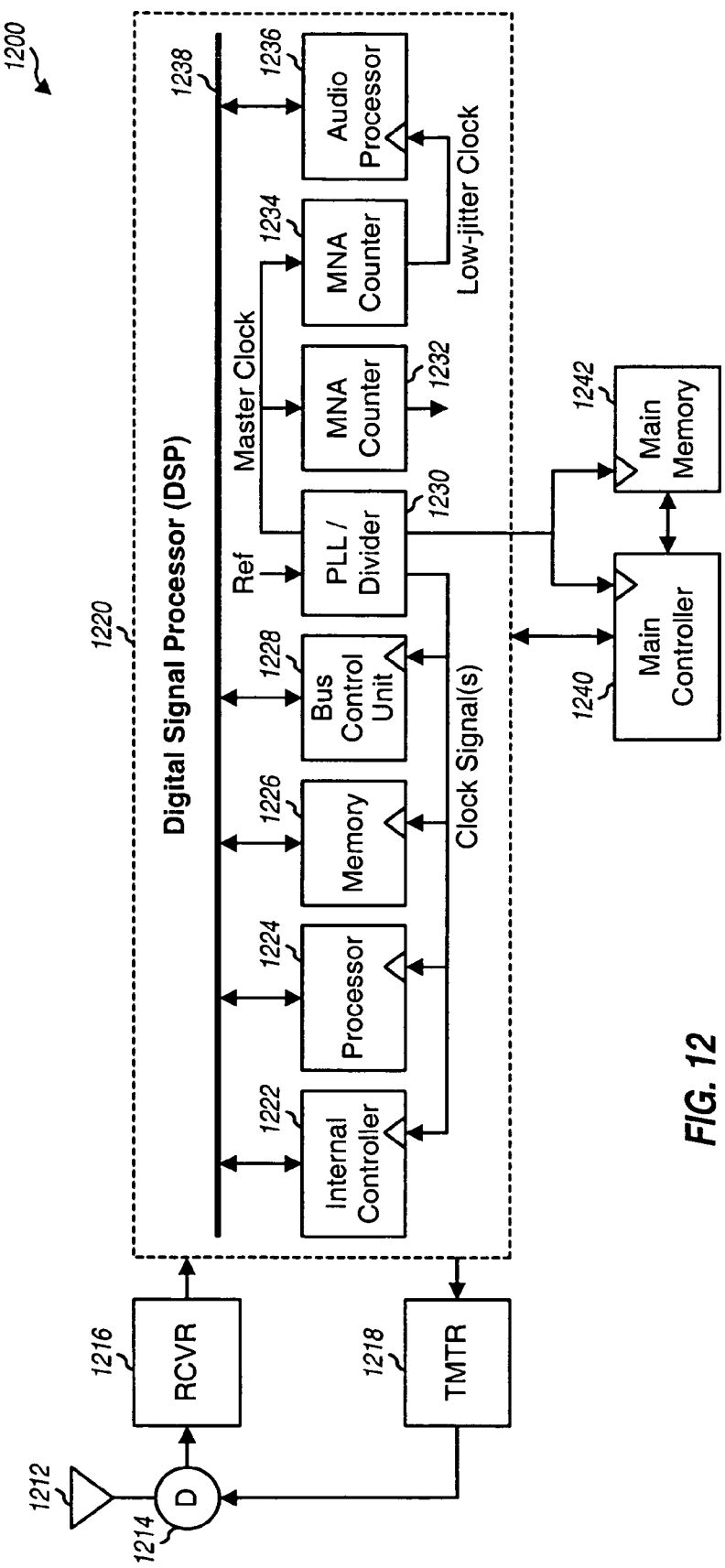
FIG. 12 shows a wireless device in a wireless communication system.

FIG. 12 shows a block diagram of a wireless device 1200 in a wireless communication system. Wireless device 1200 may be a cellular phone, a terminal, a handset, or some other devices or designs. The wireless communication system may be a Code Division Multiple Access (CDMA) system, a Global System for Mobile Communications (GSM) system, a multiple-input multiple-output (MIMO) system, an orthogonal frequency division multiplexing (OFDM) system, an orthogonal frequency division multiple access (OFDMA) system, and so on. Wireless device 1200 is capable of providing bi-directional communication via a receive path and a transmit path.

For the receive path, signals transmitted by base stations are received by an antenna 1212, routed through a duplexer (D) 1214, and provided to a receiver unit (RCVR) 1216. Receiver unit 1216 conditions (e.g., filters, amplifies, and frequency downconverts) the received signal and digitizes the conditioned signal to provide samples, which are provided to a digital signal processor (DSP) 1220 for further processing. For the transmit path, data to be transmitted from wireless device 1200 is provided by DSP 1220 to a transmitter unit (TMTR) 1218. Transmitter unit 1218 conditions (e.g., filters, amplifies, and frequency upconverts) the data and generates a modulated signal, which is routed through duplexer 1214 and transmitted via antenna 1212 to the base stations.

DSP 1220 includes various processing units such as, for example, an internal controller 1222, a processor 1224, a memory unit 1226, a bus control unit 1228, and an audio processor 1236, all of which are coupled via a bus 1238. DSP 1220 further includes a PLL 1230 that receives a reference signal (e.g., from a temperature compensated crystal oscillator (TCXO)) and generates a master clock for DSP 1220. PLL 1230 may generate various clock signals (e.g., by dividing the master clock with different integer values) for the processing units within DSP 1220 and possibly for processing units external to DSP 1220 (e.g., a main controller 1240 and a main memory unit 1242). An MNA counter 1234 receives the master clock and generates a first low-jitter clock signal for audio processor 1236. An MNA counter 1234 receives the master clock and generates a second low-jitter clock signal for another processing unit (e.g., analog-to-digital converters within receiver unit 1216). The first and second low-jitter clock signals have different frequencies. In general, one MNA counter may be used to generate each different clock frequency that is not an integer multiple of the master clock. MNA counters 1232 and 1234 may each be implemented with MNA counter 400 in FIG. 4. DSP 1220 may include various processing units and perform various functions, which may be dependent on the specific design of DSP 1220 and the communication system.

FIG. 12 shows an exemplary design of a wireless device in which the MNA counter described herein may be implemented and used. The MNA counter described herein may also be implemented in other electronic devices.

The direct digital synthesizer with analog interpolation (i.e., the MNA counter) described herein may be implemented in an application specific integrated circuit (ASIC), a digital signal processor (DSP), a digital signal processing device (DSPD), a programmable logic device (PLD), a field programmable gate array (FPGA), a processor, a controller, a micro-controller, a microprocessor, and other electronic units. The MNA counter may be implemented within the one or multiple integrated circuit (IC) dies and in the one or multiple ICs. For example, all units of the MNA counter may be implemented on one IC die. As another example, the digital portion of the MNA counter (e.g., MN counter 420, dither generator 440, inverse unit 450, multiplier 460, and D flip-flops 422 and 424 in FIG. 4) may be implemented on one IC die and the analog portion of the MNA counter (e.g., delay generator 470 and current generator 480) may be implemented on another IC die.

The MNA counter may also be fabricated with various IC process technologies such as CMOS, NMOS, BJT, and so on. The MNA counter may also be fabricated using different device size technologies (e.g., 0.13 mm, 30 nm, and so on).

Portions of the MNA counter (e.g., inverse unit 450 and multiplier 460) may be implemented in software. For a software implementation, the modules (e.g., procedures, functions, and so on) may be used to perform some of the functions described herein. The software codes may be stored in a memory unit (e.g., memory unit 1226 or 1242 in FIG. 12) and executed by a processor (e.g., processor 1224 or controller 1240). The memory unit may be implemented within the processor or external to the processor, in which case it can be communicatively coupled to the processor via various means as is known in the art.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An integrated circuit comprising:
 a counter operative to receive an input clock signal with a first frequency, an M value and an N value, where the M value and the N value are each integer values, and to generate a counter signal having a second frequency determined by the M value and the N value, wherein the counter is operative to accumulate the M value using a modulo-N accumulator for each cycle of the input clock signal; and
 a delay generator operative to receive the counter signal and an L-bit control signal, where L is an integer greater than one, to generate a differential signal based on the counter signal and the L-bit control signal, and to use the differential signal to provide an output clock signal having the second frequency, wherein leading edges of the output clock signal are variably delayed in accordance with the L-bit control signal.

2. A device in a communication system, comprising:
 a counter operative to receive an input clock signal with a first frequency, an M value, and an N value, where the M value and the N value are integer values, and to generate a counter signal having a second frequency determined by the M value and the N value, wherein the counter is operative to accumulate the M value using a modulo-N accumulator for each cycle of the input clock signal; and
 a delay generator operative to receive the counter signal and an L-bit control signal, where L is an integer value greater than one, to generate a differential signal based on the counter signal and the L-bit control signal, and to use the differential signal to provide an output clock signal having the second frequency, wherein leading edges of the output clock signal are variably delayed in accordance with the L-bit control signal.

3. A method comprising:
 receiving an input clock signal with a first frequency, an M value and an N value, where the M value and the N value are each integer values;
 generating a counter signal having a second frequency determined by the M value and the N value by accumulating the M value using a modulo-N accumulator for each cycle of the input clock signal;
 receiving the counter signal and an L-bit control signal, where L is an integer greater than one;
 generating a differential signal based on the counter signal and the L-bit control signal;
 using the differential signal to provide an output clock signal having the second frequency, wherein leading edges of the output clock signal are variably delayed in accordance with the L-bit control signal.

* * * * *